United States Patent [19]

Mikami et al.

[11] 4,039,615
[45] Aug. 2, 1977

[54] PRODUCTION OF ALUMINUM SULFATE

[75] Inventors: Yasuie Mikami; Ippo Takei; Kazuo Soma, all of Tokyo; Yasuo Morimoto, Takatsuki; all of Japan

[73] Assignee: Nittetsu Mining Company, Limited, Tokyo, Japan

[21] Appl. No.: 644,923

[22] Filed: Dec. 29, 1975

Related U.S. Application Data

[63] Continuation of Ser. No. 416,293, Nov. 15, 1973, abandoned.

[51] Int. Cl.$^2$ .......................... C01F 7/74; B01D 9/02
[52] U.S. Cl. ................................ 423/128; 23/295 R; 23/301 R; 23/305 A; 423/111; 423/132; 423/556
[58] Field of Search ............... 423/111, 128, 132, 556; 23/295, 300, 305, 301 R

[56] References Cited

U.S. PATENT DOCUMENTS

| | | | |
|---|---|---|---|
| 2,402,668 | 6/1946 | Roller | 423/128 |
| 2,951,743 | 9/1960 | Kretzschmak | 423/128 |
| 2,958,580 | 11/1960 | Loevenstein | 423/128 |
| 3,141,743 | 6/1964 | Marsh | 23/305 |
| 3,143,392 | 8/1964 | Saeman | 423/128 |
| 3,397,951 | 8/1968 | Jamey et al. | 423/128 |

OTHER PUBLICATIONS

Skoog & West, Fundamentals of Analytical Chemistry, Holt, Rinehart & Winston, N.Y., N.Y. 1963 pp. 175–187.

Kirk-Othmer, Encyclopedia of Chemical Technology, 2nd edition, John Wiley & Sons, Inc., N.Y., N.Y., 1963, pp. 59–63.

Primary Examiner—O. R. Vertiz
Assistant Examiner—Gary P. Straub
Attorney, Agent, or Firm—Oblon, Fisher, Spivak, McClelland & Maier

[57] ABSTRACT

Hexagonal plate crystals of aluminum sulfate are produced in chemically pure form by a process which comprises cooling a heated saturated solution of chemically impure aluminum sulfate acidified with sulfuric acid to precipitate crystals of aluminum sulfate, heating the slurry of the cooled solution containing the precipitated aluminum sulfate crystals to a predetermined temperature wherein the temperature is maintained for a time sufficient to dissolve a portion of the crystals in the solution, cooling the heated slurry to precipitate aluminum sulfate crystals, and separating the precipitated crystals from the slurry.

4 Claims, 3 Drawing Figures

PRODUCTION OF ALUMINUM SULFATE

This is a continuation, of application Ser. No. 416,293, filed Nov. 15, 1973 now abandoned.

BACKGROUND OF THE INVENTION

1. Field of the Invention

This invention relates to improvements in the production of hexagonal plate crystals of aluminum sulfate from chemically impure aluminum sulfate solutions.

2. Description of the Prior Art

Glue-like, fibrous, and in some instances, flake crystals of aluminum sulfate can be obtained by treating minerals containing alumina with sulfuric acid, extracting aluminum salts from the mineral and crystallizing aluminum sulfate from the extracted solution. Crystalline aluminum sulfate can also be obtained together with iron sulfate from waste sulfuric acid or the like which contains considerable amounts of iron and aluminum. However, aluminum sulfate crystals cannot be separated easily from crystals of the other materials in these processes.

Heretofore, chemically pure aluminum sulfate crystals have been generally obtained by crystallizing the impure aluminum salts from previously purified aluminum sulfate solutions. However, these purification procedures have been troublesome and it has been difficult to obtain chemically pure aluminum sulfate crystals inexpensively by those prior art techniques. A need, therefore, continues to exist for a simple, low-cost method of obtaining pure, crystalline aluminum sulfate.

SUMMARY OF THE INVENTION

Accordingly, one object of the present invention is to provide a method of producing hexagonal plate crystals of extremely pure aluminum sulfate.

Another object of the present invention is to provide a method of producing hexagonal plate crystals of extremely pure aluminum sulfate of uniform size.

Yet another object of the present invention is to provide a method of producing extremely pure sulfate crystals in good yield.

Briefly, these objects and other objects of the invention as hereinafter will become more readily apparent, can be achieved by a process for producing extremely pure aluminum sulfate which comprises cooling a heated, saturated solution of chemically impure aluminum sulfate acidified with sulfuric acid to precipitate crystals of aluminum sulfate, heating the slurry of the cooled solution containing the precipitated aluminum sulfate crystals to a predetermined temperature wherein the temperature is maintained for a time sufficient to dissolve a portion of the crystals in the solution, cooling the heated slurry to precipitate aluminum sulfate crystals and separating the precipitated crystals from the slurry.

BRIEF DESCRIPTION OF THE DRAWINGS

A more complete understanding of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

In the process of the present invention, glue-like, chemically impure aluminum sulfate crystals are crystallized by cooling an aluminum sulfate solution which is saturated at higher temperatures. Thereafter, the solution containing the precipitated crystals is heated without separating the crystals so that a portion of each of the precipitated crystals dissolve resulting in an unsaturated solution. The solution is maintained in this state for some time in order to dissolve the impurities in the crystals. This step hereinafter is designated as the "orientation process." Also, the time in which the solution containing the precipitated crystals is heated for the partial dissolution of the crystals is hereinafter designated as the "time for orientation." Then the solution containing the crystals is allowed to cool again to the super-saturated state, whereby oriented crystal seeds are grown. By this procedure, chemically pure hexagonal plate crystals of aluminum sulfate are obtained and extremely pure aluminum sulfate crystals of a large uniform size are grown by repeating this process. The "orientation process" is similar to the aging process in the production of metals or semiconductors. It is believed that the impurities in the crystals are dissolved during the "orientation process" by the difference between the distribution coefficients of the solid and liquid states as in the case of zone melting processes.

Figure 1:
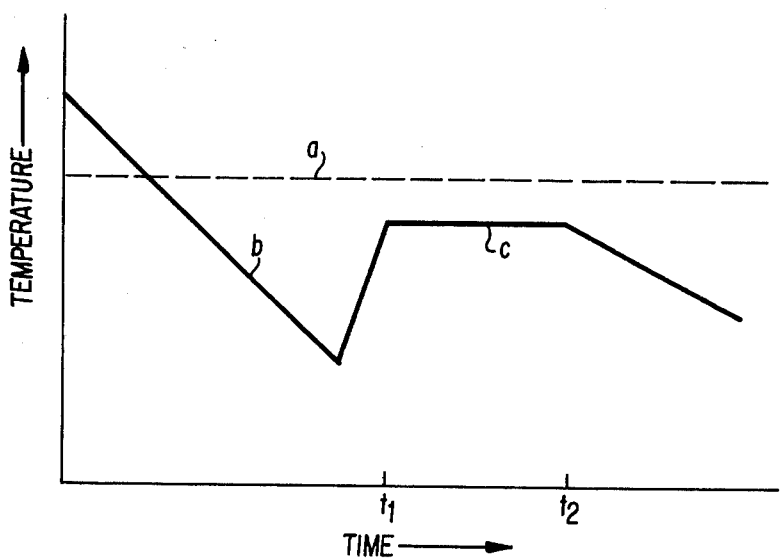
FIG. 1 shows the process conditions for one embodiment of the process of the present invention.

For a more thorough understanding of the process, reference is made to FIG. 1. FIG. 1 shows a case in which chemically pure aluminum sulfate crystals are prepared from an aluminum sulfate solution acidified with sulfuric acid containing 73.1 g/l of $Al_2O_3$, 4.06 g/l of total Fe (hereinafter abbreviated as T.Fe), 362.8 g/l $SO_3$, and the like. Line $a$ in FIG. 1 designates a saturated state while $b$ designates the first processing line wherein glue-like crystals of aluminum sulfate precipitate from a saturated aluminum sulfate solution and $c$ designates the second processing line wherein $t_2 - t_1$ is the time of orientation.

Figure 3:
FIG. 3 is a microphotograph of the aluminum sulfate crystals produced by the process of the present invention.

Glue-like aluminum sulfate crystals precipitate from an acidic solution of aluminum sulfate having the above-mentioned composition by cooling the solution from 60° C to 25° C along the first processing line $b$ at the rate of 8° C/hr. This is the maximum allowable cooling rate for crystal growth as deduced from a series of extensive experiments. The solution containing the crystals is then heated to 45° C along the second processing line $c$ which is maintained for various times during the orientation at 45° C. The solution is then cooled to 25° C whereby hexagonal plate crystals of considerable thickness are obtained which have the compositions shown in Table I and the crystal structure shown in FIG. 3.

TABLE I

| Time of Orientation Hours ($t_2 - t_1$) | Crystallized Aluminum Sulfate (mg/g) | | | | |
|---|---|---|---|---|---|
| | Fe | $Al_2O_3$ | $SO_3$ | $Fe/Al_2O_3$ | $SO_3/Al_2O_3$ |
| 1 | 1.61 | 107.7 | 311.0 | 0.01494 | 2.89 |
| 2 | 1.49 | 109.5 | 307.9 | 0.01361 | 2.81 |
| 3 | 1.32 | 119.1 | 327.8 | 0.01108 | 2.75 |
| 4 | 1.19 | 124.3 | 340.0 | 0.00957 | 2.73 |
| 5 | 0.86 | 135.2 | 355.9 | 0.00630 | 2.63 |
| 6 | 0.84 | 140.7 | 374.1 | 0.00597 | 2.66 |

It is obvious from the data in Table I the amounts of Fe gradually decrease depending on the time of orientation until a constant value is attained after 5 hours.

The heating and cooling processes are then repeated several times at an orientation time of 5 hours without separating the crystals. Large hexagonal plate crystals having the chemical composition shown in Table II are obtained by the repetition of this process.

TABLE II

| Number of Times Orientated | Crystallized Aluminum Sulfate (mg/g) | | | | |
|---|---|---|---|---|---|
| | Fe | $Al_2O_3$ | $SO_3$ | $Fe/Al_2O_3$ | $SO_3/Al_2O_3$ |
| 1 | 0.856 | 135.2 | 355.9 | 0.0063 | 2.63 |
| 2 | 0.818 | 137.6 | 369.2 | 0.0059 | 2.68 |
| 3 | 0.684 | 140.5 | 357.6 | 0.0049 | 2.55 |
| 4 | 0.751 | 139.7 | 356.9 | 0.0054 | 2.55 |
| 5 | 0.742 | 141.0 | 370.3 | 0.0053 | 2.63 |

Table II shows that the Fe content in the crystallized aluminum sulfate decreases by repetition of the heating and cooling processes until a constant value is obtained after 3 repetitions of the heating and cooling cycle.

Impure aluminum sulfate solutions having a composition of about 50 - 85 g/l of $Al_2O_3$ and a $SO_3/Al_2O_3$ weight ratio of 4 - 10 are suitable for use in the present invention.

The time at which the orientation process begins is decided as follows: The orientation process should not be continued in order to shorten the time for orientation when the precipitated crystals are too small, because the action of the seed crystals is weakened and the number of crystals is diminished during the crystallization stage along the second processing line. It is also not recommended to continue the orientation process in the middle of the first processing line to favorably change the form of aluminum sulfate crystals by utilizing the difference between the rate of dissolution of the crystals and the rate of growth of the crystals. It is recommended that the orientation process be continued after the completion of crystallization along the first processing line at room temperatures. It is also recommended that the temperature of the second processing line c be maintained about 5° - 20° C higher than the temperature at the end of the first processing line b. The higher the temperature of the orientation process, the shorter should be the time for orientation.

This method, in which a vast volume of aluminum sulfate solution is heated and cooled, is not economical for the industrial production of aluminum sulfate crystals. However, this disadvantage may be eliminated by adding hexagonal plate crystals of aluminum sulfate or a portion of a slurry containing the hexagonal plate crystals produced by the method above to a saturated solution or an almost saturated solution of chemically impure aluminum sulfate, and then cooling the system to precipitate crystals of extremely pure aluminum sulfate. The extremely pure aluminum sulfate crystals may be obtained by the method above in one step without precipitating the glue-like aluminum sulfate crystals from the impure aluminum sulfate solution. The addition of about 5 weight percent of the hexagonal plate crystals to a chemically impure solution of aluminum sulfate is sufficient to effect the production of the chemically pure aluminum sulfate crystals. This method for the production of hexagonal plate crystals of chemically pure aluminum sulfate from impure aluminum sulfate solutions is recommended only in the cases where the contents of impurities such as Fe, Mn, Si and the like are relatively small. It is not recommended, for example, where the content of Fe exceeds the saturation state when aluminum sulfate crystals are precipitated, because iron sulfate, a eutectic mixture of iron sulfate and aluminum sulfate, a double salt of iron and aluminum compounds, and the like are also precipitated with the aluminum sulfate crystals and impure aluminum sulfate crystals result.

The disadvantage of having a high content of iron impurities can be eliminated as follows. An impure acidic aluminum sulfate solution containing considerable amounts of iron sulfate can be concentrated to a saturated solution at a temperature of 30° - 80° C, preferably from 40° - 60° C, and iron sulfate precipitates and is separated. The iron sulfate should not be removed from the saturated solution below 30° C, because the quantity of the precipitated iron sulfate decreases, and the crystals obtained are the undesired heptahydrate crystals of iron sulfate. Also, the solution should not be concentrated above 80° C, because too much iron sulfate is precipitated, disorder is created in the separation of iron sulfate crystals and expensive metals are necessary for use in the construction of the process equipment to guard against corrosion. The most appropriate temperature for this process is 40° - 60° C, and the iron sulfate crystals are crystallized as the monohydrate in the temperature range. Aluminum sulfate crystals are then crystallized from the solution as follows. Small amounts of water are added to the solution to prevent the precipitation of the remainder of iron sulfate in the solution with aluminum sulfate as iron sulfate or as double salts of iron and aluminum compounds when the aluminum sulfate crystals are precipitated. If this procedure is followed, hexagonal plate crystals of aluminum sulfate are crystallized. The smaller the amount of water added, the better the method. However, the amount of water is decided by the mutual relationship between the concentrations of free sulfuric acid, aluminum sulfate and iron sulfate. Solutions containing considerable amounts of free sulfuric acid or iron sulfate require greater amounts of water, and solutions containing greater amounts of aluminum sulfate need less water.

Because of the high solubility of aluminum sulfate, the crystallization rate of aluminum sulfate from aluminum sulfate solutions is limited. Of course, the method of the present invention is repeated as often as possible to obtain as many aluminum sulfate crystals as possible.

Figure 2:
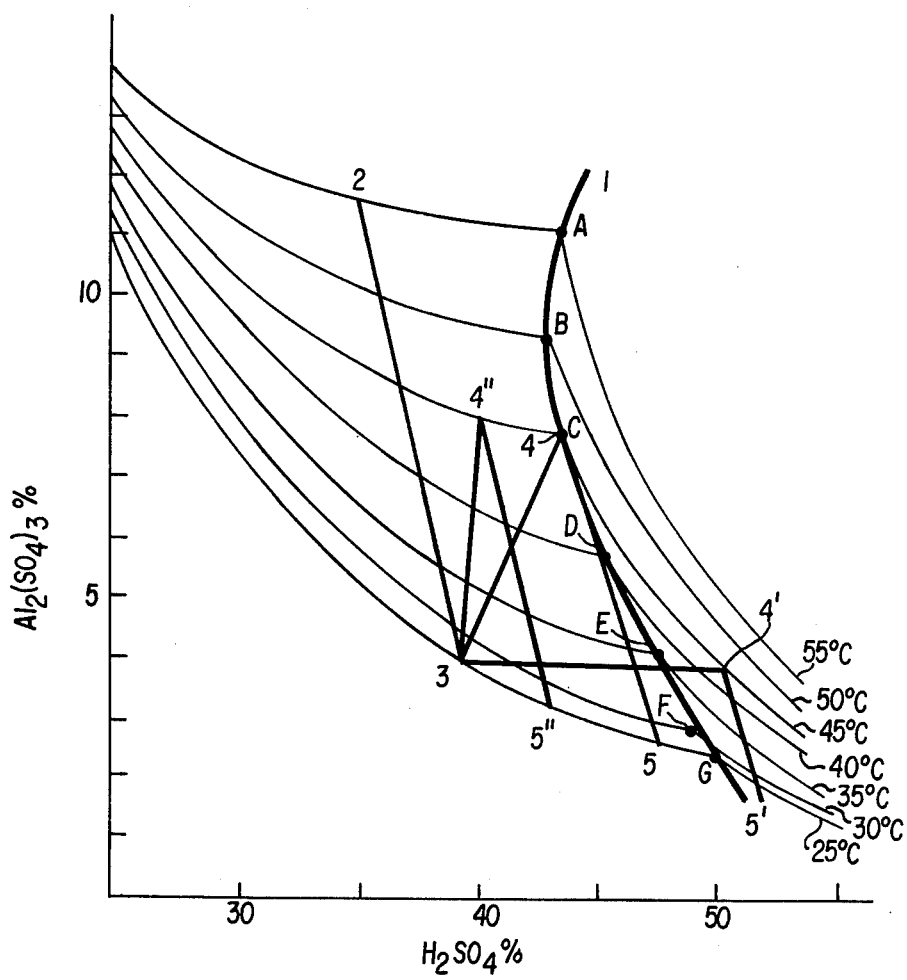
FIG. 2 shows the dependance of the concentration of sulfuric acid in aluminum sulfate solution on the concentration of aluminum sulfate in solution at various temperatures when hexagonal plate crystals of aluminum sulfate are crystallized by adding seed crystals of aluminum sulfate to a saturated solution of aluminum sulfate.

It has been found that the crystallization rate of aluminum sulfate increased by increasing the concentration of sulfuric acid in the aluminum sulfate solution containing hexagonal plate crystals of aluminum sulfate at various temperatures. The results of the experiments are shown in FIG. 2. The points A, B, C, D, E, F and G are the boundary points where the hexagonal plate crystals are precipitated by adding 5% by weight of hexagonal plate crystals of aluminum sulfate in a saturated solution, to aluminum sulfate solutions maintained at 55°, 50°, 45°, 40°, 35°, 30° and 25° C. and thereafter cooling the solutions.

Hexagonal plate crystals with the best yields are obtained at the boundary points. To the left of these points lesser amounts of hexagonal plate crystals are obtained, and to the right of these points hexagonal plate crystals are not crystallized. It is obvious from these results that line 1 connecting the points A, B, C, . . . and G in the processing line along which the highest yields of hexagonal plate crystals of aluminum sulfate are obtained by adding hexagonal plate crystals to a saturated solution of aluminum sulfate and then cooling the solution. It is recommended that greater amounts (at least 5%) of hexagonal plate crystals be added to the saturated or nearly saturated solution. However, the addition of amounts of crystals which correspond to about 5 – 15% of the aluminum sulfate in the saturated or nearly saturated solution of aluminum sulfate is recommended from an economic point of view.

In the process of this invention it is preferable to cool the solution at a cooling rate of less than 8° C/hr to obtain hexagonal plate crystals after the addition of seed crystals of aluminum sulfate to the saturated or nearly saturated solution of aluminum sulfate. It is also preferable to cool the solution after the subsequent addition of sulfuric acid to the aluminum sulfate solution containing added hexagonal plate crystals. It is recommended that the solution be cooled at a rate less than 10° C/hr after a portion of the crystals, especially the glue-like or fibrous crystals are dissolved by heating at a predetermined temperature for less than 3 hours. In the latter case, the cooling rate of the solution may be increased.

It is somewhat preferable to use concentrated sulfuric acid as concentrated sulfuric acid instead of dilute sulfuric acid because the saturated solution of aluminum sulfate is warmed by the heat of dilution of concentrated sulfuric acid which obviates additional heating of the solution of aluminum sulfate.

By the process of the present invention, hexagonal plate crystals of aluminum sulfate may be obtained in extremely high purity. In addition, the yield of aluminum sulfate may be increased by more than 20% by weight over those cases where sulfuric acid is not added to the aluminum sulfate solution containing added hexagonal plate crystals.

Having generally described this invention, a further understanding can be obtained by reference to certain specific examples which are provided herein for purposes of illustration only and are not intended to be limiting unless otherwise specified.

EXAMPLE 1

One liter of aluminum sulfate solution acidified with sulfuric acid containing 73.1 g/l of $Al_2O_3$, 4.06 g/l of T.Fe and 362.8 g/l of $SO_3$ as the main components was cooled to 25° C at the cooling rate of 3° C/hr. as shown by the first processing line b to precipitate aluminum sulfate crystals. The solution containing the precipitated crystals was heated at 45° C and was maintained at the temperature for 5 hours as shown by the second processing line c. Thereafter, the solution containing the crystals was cooled to 25° C to crystallize the aluminum sulfate. The above heating and cooling processes were repeated three times and 300 g of aluminum sulfate of a particle size ranging from 0.2 to 0.5 mm were obtained. The purity of the crystals obtained was similar to that of the three repetitions of Table II.

EXAMPLE 2

A carbonaceous shell containing 25.0% of $Al_2O_3$, 61.1% of $SiO_2$, 4.5% of $Fe_2O_3$, 0.69% of MgO, 2.04% of CaO, and 2.70% of alkali was ground to a size below 3 mm, and calcined at 650° – 750° C for about 1 hour. Twenty-three liters of 30% sulfuric acid was added to 10 kg of the calcined shell, the mixture was heated for 2 hours at 100° C, insoluble portions were separated by filtration and 25 liters of extract including the wash water and containing 78.9 g/l of $Al_2O_3$, 9.52 g/l of T.Fe and 268.7 g/l of $SO_3$ were obtained. Gaseous $SO_2$ was introduced into the extract to increase the amount of the reduced $Fe^{2+}$ ions, and thereafter, the mother liquor for the crystallization process containing 76.6 g/l of $Al_2O_3$, 365.1 g/l of $SO_3$, 9.30 g/l of T.Fe and a weight ratio of $SO_3$ to $Al_2O_3$ of 4.77 was prepared by adding sulfuric acid. A portion of this mother liquor was transferred to a crystallizing vessel equipped with an agitator and cooled to 45° C to crystallize the aluminum sulfate. Thereafter, the solution was heated to 55° C and maintained at the temperature for 5 hours in order to dissolve a portion of the precipitated crystals and then cooled to 40° C. The solution was reheated to 50° C where the temperature was maintained for 5 hours and then cooled to 35° C. Once again, the solution was heated to 45° C which was maintained for 5 hours and then cooled to 30° C. Again the solution was heated to 40° C which was maintained for 5 hours and finally cooled to room temperature. The aluminum sulfate crystals which had precipitated were separated, and hexagonal plate crystals of aluminum sulfate of considerable thickness and having a composition of 14.7% $Al_2O_3$, 0.18% T.Fe and 36.9% $SO_3$ were obtained.

A 150 g amount of these crystals was added to 3 liters of the above mother liquor in the crystallizing vessel as seed crystals. The solution containing the seed crystals was then cooled gradually to room temperature, and the precipitated crystals were separated. Fourteen kilograms of extremely pure aluminum sulfate crystals having a composition of 15.4% $Al_2O_3$, 0.05% T.Fe and 36.4% $SO_3$ were obtained by washing the separated crystals with a saturated solution of chemically pure aluminum sulfate.

EXAMPLE 3

A clay having the composition of 26.4% $Al_2O_3$, 46.84% $SiO_2$, 6.32% T.Fe, 0.45% CaO, 0.78% MgO, 0.62% $Na_2O$, 0.14% $K_2O$, and 14.3% ignition loss was calcined at 650° – 750° C for one hour, and the calcined clay having the composition of 30.3% $Al_2O_3$, 7.88% T.Fe, and 50.2% $SiO_2$ was obtained. A 5.9 liter amount of 30% sulfuric acid was added to 2.5 kg of this calcined clay, the mixture was heated to 100° C and maintained at this temperature for two hours. A 6 liter amount of the extract having the composition of 89.8 g/l $Al_2O_3$, 14.8 g/l T.Fe, 278.7 g/l $SO_3$, 0.39 g/l CaO, 2.50 g/l MgO and 1.3 g/l $SiO_2$ was obtained. A solution having the composition of 82.5 g/l $Al_2O_3$ and a $SO_3/Al_2O_3$ ratio of 4.6 (weight percent) was produced by adding sulfuric acid to this extract. The crystals produced in Example 2 and having the composition of 14.7% $Al_2O_3$, 0.18% T.Fe, and 36.9% $SO_3$ was added as 5% seed crystals to 3 liters of the solution. A 1.4 kg amount of hexagonal plate crystals of aluminum sulfate having the composition of 14.4% $Al_2O_3$, 0.3% T.Fe and 35.7% $SO_3$ were obtained after cooling the solution. A solution having the composition of 84.8 g/l $Al_2O_3$, 1.77 g/l T.Fe, 0.05%

Fe³⁺ and 210.6 g/l SO₃ was obtained by dissolving the crystals with water and then introducing SO₂ gas into the solution to reduce ferric ion to ferrous ion. One hundred grams of ammonium sulfate were added to 2 liters of this solution. The solution was then heated at 200° C for 2 hours in an autoclave, and about 270 g of basic aluminum sulfate were obtained after cooling. A chemically pure aluminum having the composition of 0.005% T.Fe, 0.016% $SiO_2$, 0.027% CaO, 0.003% MgO, 0.08% $Na_2O$ + $K_2O$, 0.008% P and 0.10% of $SO_3$ was obtained by the calcination of this basic aluminum sulfate.

EXAMPLE 4

Five liters of a solution containing 6.55 g/l of Al, 39.94 g/l of T.Fe and 203.50 g/l of free sulfuric acid as the main components were concentrated until the concentration of Al in the solution increased to 19.48 g/l. A 750 g quantity of $FeSO_4 \cdot H_2O$ was precipitated at 80° C and the main components of the solution changed to 19.48 g/l of Al, 8.74 g/l of T.Fe and 644 g/l of free sulfuric acid. Then the solution was diluted to 16.50 g/l of Al with water and maintained at 55° C. The diluted solution was then cooled to 25° C at the rate of 3° C/hr. The solution was heated to 36° C without separating the precipitated crystals, maintained at this temperature for 4 hours, and then cooled to 25° C at the rate of 3° C/hr. This heating and cooling process was repeated four times, and finally 298.96 g of hexagonal plate crystals of aluminum sulfate having the composition of 7.71% of Al and 0.01% of T.Fe were obtained. A 1.2 liter quantity of sulfuric acid having 549.2 g/l of free sulfuric acid was also recovered.

EXAMPLE 5

A five liter quantity of the solution containing 7.23 g/l of Al, 39.39 g/l of T.Fe and 204.20 g/l of free sulfuric acid was concentrated until the concentration of Al in the solution was increased to 20.41 g/l. A 740 g. quantity of $FeSO_4 \cdot H_2O$ precipitated at 80° C, and 1.78 liters of filtrate were obtained. The filtrate was diluted with water until the concentration of Al decreased to 17.76 g/l. A 100 g amount of chemically pure aluminum sulfate hexagonal plate crystals was added to the solution while the solution was maintained at 46° C. The solution was cooled to 25° C at the rate of 3° C/hr to precipitate the aluminum sulfate crystals. A 408 g quantity of hexagonal plate crystals of aluminum sulfate having the composition of 6.10% of Al, 0.40% of T.Fe and 44.41% of $T.SO_4$ was obtained. 1.50 Liters of the separated mother liquor containing 542.6 g/l of free sulfuric acid was also recovered.

EXAMPLE 6

A 563 g amount of hexagonal plate crystals of chemically pure aluminum sulfate was added to 7.5 liters of a saturated solution of aluminum sulfate containing 36.11 g/l of Al, 489.66 g/l of $H_2SO_4$ and 0.46 g/l of T.Fe maintained at 55° C, which corresponds to point 2 in FIG. 2. Aluminum sulfate then precipitated on the added hexagonal plate crystal seeds upon cooling to 25° C at the rate of 5° C/hr, which corresponds to point 3 in FIG. 2. 95% $H_2SO_4$ was added to this solution containing the crystals until the concentration of the sulfuric acid in the solution corresponded to point 4 in FIG. 2. The solution was then heated to 45° C, maintained at the temperature for 30 min. and then aluminum sulfate crystals precipitated upon cooling to 27° C at the rate of 5° C/hr. These conditions correspond to point 5 in FIG. 2. A 3.490 g amount of hexagonal plate crystals of aluminum sulfate containing 7.45% of Al and 0.00% of Fe was obtained. A 6.6 liter quantity of separated mother liquor containing 8.00 g/l of Al, 556.81 g/l of total $H_2SO_4$ and 0.58 g/l T.Fe was also recovered.

In a comparison experiment, 95% $H_2SO_4$ was added to the aluminum sulfate solution containing seed crystals until the concentration of the sulfuric acid in the solution corresponded to point 4'. The solution was heated to 45° C and then cooled to the conditions of point 5' to precipitate the aluminum sulfate crystals. The yield of the aluminum sulfate crystals was almost the same as that obtained above. However, the shape of the crystals obtained was not a hexagonal plate, and the crystals contained 5.82% Al and 0.04% Fe. 95% $H_2SO_4$ was then added to the solution so that the concentration of the sulfuric acid in the solution corresponded to 4". The solution was heated to 45° C, and then cooled until the conditions of point 5" were reached to precipitate aluminum sulfate crystals. Hexagonal plate crystals of pure aluminum sulfate were also obtained, but at substantially decreased yields.

Having now fully described the invention, it will be apparent to one of ordinary skill in the art that many changes and modifications can be made thereto without departing from the spirit or scope of the invention as set forth herein.

What is claimed as new and intended to be covered by letters patent is:

1. A process for the production of hexagonal plate crystals of aluminum sulfate, which comprises the steps of:
   a. cooling at a rate of less than 8° C/hour a hot, chemically impure saturated solution of aluminum sulfate acidified with sulfuric acid which contains 50-85 g/l of $Al_2O_3$ and the weight ratio of $SO_3$ to $Al_2O_3$ in the saturated solution is in the range of 4:1 to 10:1 to precipitate crystals of aluminum sulfate, the solution containing iron sulfate in an amount such that the iron sulfate is not precipitated with the aluminum sulfate crystals;
   b. heating the resultant slurry containing the precipitated aluminum sulfate crystals to a temperature below the minimum temperature at which all the precipitated aluminum sulfate is capable of dissolving in the solution and maintaining it at that temperature for at least one hour to dissolve only a part of the crystals in the solution;
   c. cooling the slurry to cause the aluminum sulfate crystals to grow; and
   d. recovering said hexagonal plate aluminum sulfate crystals from the slurry 2. The process of claim 1, wherein steps (a) and (b) are repeated.

3. The process of claim 1, wherein the slurry containing aluminum sulfate crystals obtained from step (a) is heated by 5° - 20° C and maintained at the elevated temperature for at least 3 hours.

4. A process for the production of hexagonal plate crystals of chemically pure aluminum sulfate which comprises:
   a. cooling at a rate of less than 8° C/hour a hot, chemically impure saturated solution of aluminum sulfate, acidified with sulfuric acid, which contains 50-85 g/l of $Al_2O_3$, wherein the weight ratio of $SO_3$ to $Al_2O_3$ in the saturated solution is in the range of 4:1 to 10:1 to precipitate crystals of aluminum sulfate, and wherein said solution contains iron sulfate in an amount such that the iron sulfate is not precipitated with the aluminum;

b. heating the resultant slurry containing the precipitated aluminum sulfate crystals to a temperature below the minimum temperature at which all the precipitated aluminum sulfate will dissolve into the solution, and maintaining said slurry at said temperature for at least one hour to dissolve only a portion of the crystals in the solution;

c. Cooling the slurry to cause the aluminum sulfate crystals to grow;

d. recovering hexagonal plate aluminum sulfate crystals to be used as seed crystals for subsequent processing;

adding 5% of said seed crystals to additional amounts of said hot impure saturated solution of aluminum sulfate to form a slurry;

adjusting the sulfuric acid concentration in said slurry to from 43–50 wt.%;

heating the slurry to a temperature at which essentially pure hexagonal plate aluminum sulfate crystals begin to grow;

maintaining the slurry at this temperature for less than three hours;

cooling said slurry at a rate not exceeding less than 8° C/hour to cause said hexagonal plate aluminum sulfate crystals to grow; and recovering hexagonal plate aluminum sulfate crystals.

* * * * *